(12) United States Patent
Xu et al.

(10) Patent No.: US 11,381,226 B2
(45) Date of Patent: Jul. 5, 2022

(54) RESILIENT STORAGE CIRCUITS

(71) Applicant: Microsoft Technology Licensing, LLC, Redmond, WA (US)

(72) Inventors: Yanzhong Xu, Santa Clara, CA (US); Tracey DellaRova, Wake Forest, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/114,323

(22) Filed: Dec. 7, 2020

(65) Prior Publication Data
US 2022/0182043 A1  Jun. 9, 2022

(51) Int. Cl.
H03K 3/356 (2006.01)
H03K 3/037 (2006.01)
H01L 27/092 (2006.01)

(52) U.S. Cl.
CPC ......... H03K 3/037 (2013.01); H01L 27/0928 (2013.01)

(58) Field of Classification Search
CPC .. H03K 3/037; H03K 3/012; H03K 3/356121; H03K 3/0375; H03K 3/356139
USPC .......................................... 327/202–208, 218
See application file for complete search history.

(56) References Cited

U.S. PATENT DOCUMENTS

| | | | | |
|---|---|---|---|---|
| 6,097,067 A * | 8/2000 | Ouchi | ................. | H01L 27/1203 257/369 |
| 7,298,010 B1 * | 11/2007 | Ma | ....................... | H01L 23/556 257/357 |
| 9,344,067 B1 | 5/2016 | Wu et al. | | |
| 2005/0127971 A1 * | 6/2005 | Hoff | ..................... | H03K 3/0375 327/217 |
| 2008/0180153 A1 * | 7/2008 | Sachdev | .................. | G11C 7/02 327/208 |
| 2010/0264953 A1 * | 10/2010 | Lilja | ....................... | G06F 30/39 326/12 |
| 2011/0175197 A1 * | 7/2011 | Furuta | ................. | H01L 27/0928 257/544 |

(Continued)

OTHER PUBLICATIONS

Calin, et al., "Upset Hardened Memory Design for Submicron CMOS Technology", In Proceedings of IEEE Transactions on Nuclear Science, vol. 43, Issue 6, Dec. 1996, pp. 2874-2878.

(Continued)

*Primary Examiner* — Quan Tra
(74) *Attorney, Agent, or Firm* — Fountainhead Law Group PC

(57) ABSTRACT

The present disclosure includes storage circuits, such latches. In one embodiment, a circuit includes a plurality of latches, each latch including a first N-type transistor formed in a first P-type material, a first P-type transistor formed in a first N-type material, a second N-type transistor formed in a second P-type material, and a second P-type transistor formed in a second N-type material. The first and second N-type transistors are formed in different P-wells and the first and second P-type transistors are formed in different N-wells. In other storage circuits, charge extraction transistors are coupled to data storage nodes and are biased in a nonconductive state. These techniques make the data storage circuits more resilient, for example, to an ionizing particle striking the circuit and generating charge carriers that would otherwise change the state of the storage node.

5 Claims, 5 Drawing Sheets

(56) References Cited

U.S. PATENT DOCUMENTS

2016/0246675 A1    8/2016  Gifford et al.

OTHER PUBLICATIONS

Seifert, et al., "Soft Error Susceptibilities of 22 nm Tri-Gate Devices", In Proceedings of IEEE Transactions on Nuclear Science, vol. 59, Issue 6, Dec. 2012, pp. 2666-2673.
"International Search Report and Written Opinion Issued in PCT Application No. PCT/US21/060670", dated Mar. 23, 2022, 11 Pages.

* cited by examiner

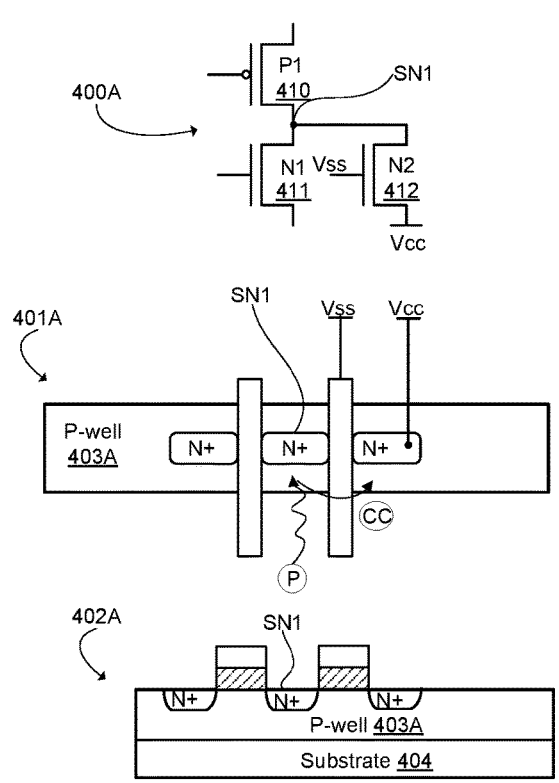
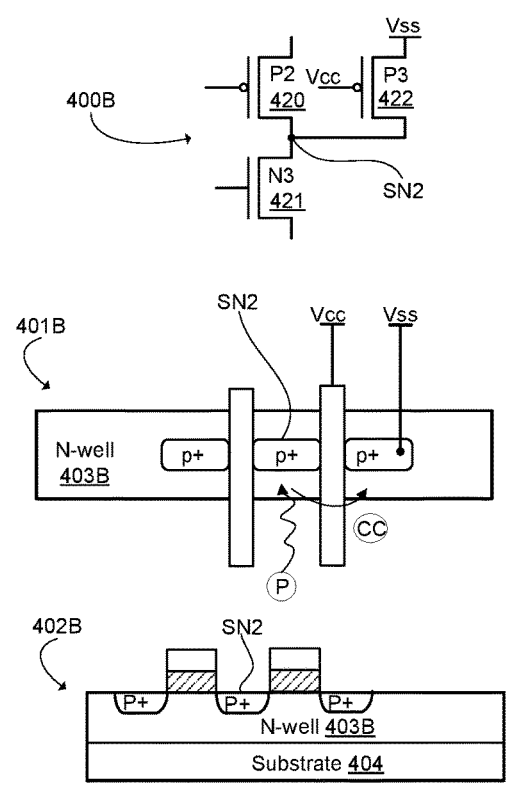
Fig. 4A
Fig. 4B

RESILIENT STORAGE CIRCUITS

BACKGROUND

The present disclosure relates generally to digital data storage circuits, and more specifically to resilient digital data storage circuits having reduced susceptibility to corruption of the data being stored.

Digital data storage circuits, such as multibit flip-flops, are utilized in a wide variety different types of circuits to store data. Multibit flip-flops may have multiple inputs and multiple outputs for storing multiple bits of information. Some multibit flip flops have a reduced size and power consumption compared to simply replicating single bit flip-flops to realize the desired number of storage bits. This reduced size and power consumption results in multibit flip-flops being used commonly in very large scale integration (VLSI) to form integrated circuits such as processors and memory devices.

As the size of components (e.g., transistors) forming the multi-bit flip-flop continues to decrease, the multibit flip-flops become more susceptible to the corruption of data being stored. For example, a particle like an ion, electron. photon, proton, or neutron may strike sensitive nodes within the multibit flip-flop. Due to the extremely small size of the transistors forming current state-of-the-art multibit flip-flops, the impact of such a particle may change the state of multiple nodes in the flip-flop and thereby change or corrupt the data being stored. Accordingly, state-of-the-art multibit flip-flops and other digital storage circuits implemented on smaller processing nodes, such as 7 nm or 5 nm, for example, may be more susceptible to data corruption.

Problematically, today's cloud-based systems may utilize a very large number of these integrated circuits to provide desired cloud-computing functionality like machine learning and neural network functionality. Data integrity in such cloud-based systems is extremely important since the corruption of data in one integrated circuit may adversely affect the proper operation of the overall system. Improved multibit flip-flops and other digital storage circuits for reliably storing data are accordingly desirable.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 4A and 4B illustrate portions of a latch circuit including a single charge extraction transistor coupled to a data storage node of the latch circuit according to further embodiments of the present disclosure.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
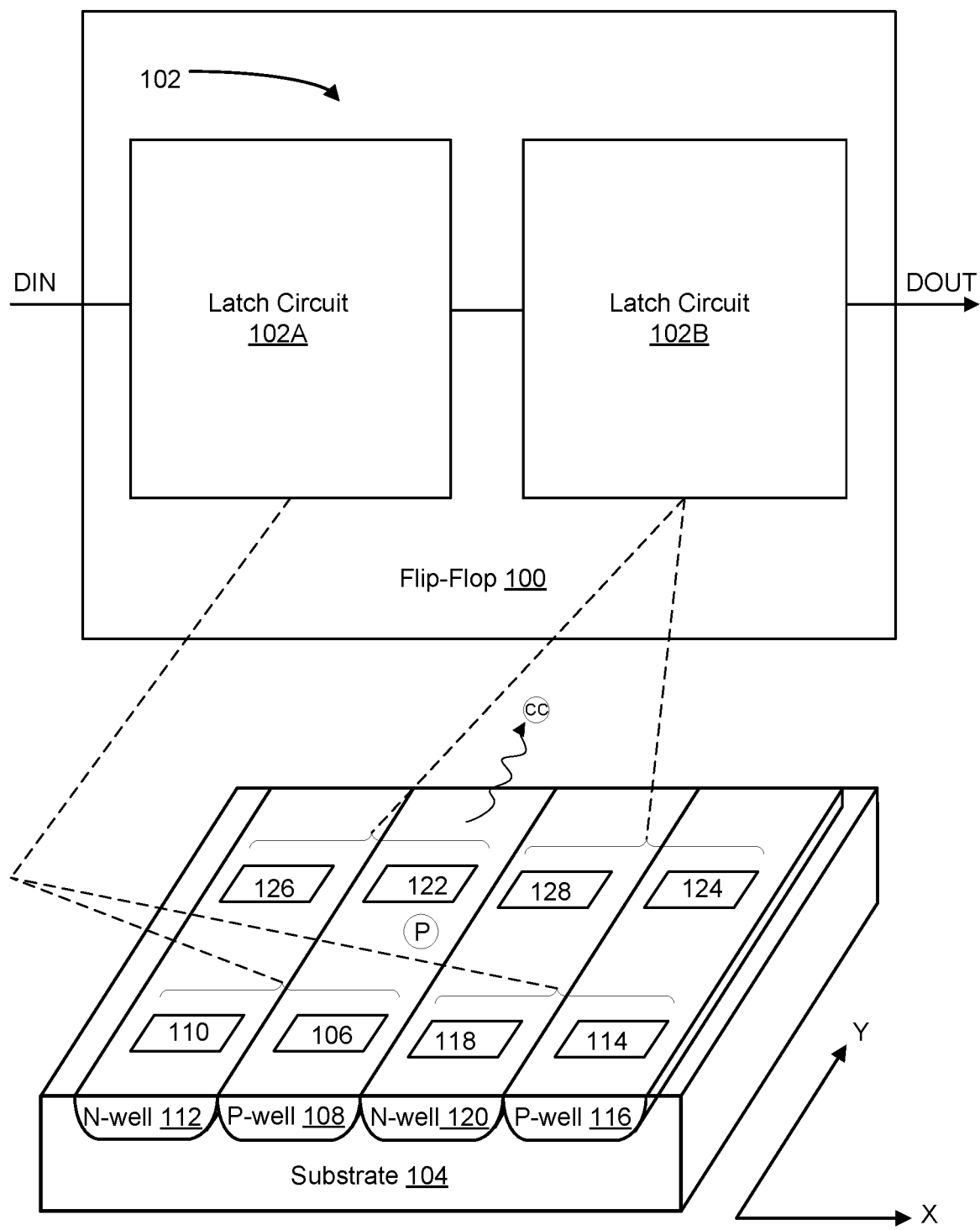
FIG. 1 is a functional block diagram and physical layout perspective view of a flip-flop according to one embodiment of the present disclosure.

FIG. 1 is a functional block diagram and physical layout perspective view of a distributed flip-flop 100 according to one embodiment of the present disclosure. The flip-flop 100 includes a plurality of latch circuits 102, two of which are illustrated in FIG. 1. More specifically, the latch circuits 102 include a first latch circuit 102A and second latch circuit 102B coupled in series between a data input DIN and data output DOUT. In operation, a data signal supplied on the data input DIN is initially stored or latched by latch circuit 102A and is thereafter supplied to second latch circuit 102B which, in turn, latches the data signal and provides the stored data on the data output DOUT.

As illustrated in the lower portion of FIG. 1, latch circuits 102A and 102B are formed in P-type and N-type materials in a substrate 104. In the embodiment of FIG. 1, latch circuit 102A includes a first N-type transistor 106 formed in a first P-type material 108, which may be a first P-well in substrate 104, for example. Latch circuit 102A further includes a first P-type transistor 110 formed in a first N-type material 112, which may be a first N-well that is formed adjacent to the first P-well 108, for example. Latch circuit 102A further includes a second N-type transistor 114 formed in a second P-type material 116, which may be a second P-well, and a second P-type transistor 118 formed in a second N-type material 120 in the form of a second N-well that is adjacent to the second P-well in the example embodiment. The latch circuit 102B has the same structure as latch circuit 102A and includes first and second N-type transistors 122 and 124 formed in the first P-well 108 and the second P-well 116, respectively, and first and second P-type transistors 126 and 128 formed in the first N-well 112 and the second N-well 120, respectively.

In the flip-flop 100, the transistors 106, 110, 114, 118 of each of the latch circuits 102A, 102B are formed in different ones of the N-wells 112, 120 and P-wells 108, 116 and are thereby arranged to prevent an upset event on a data node in each of these latch circuits from causing an upset event on another data node or nodes in the latch circuit that may change or corrupt the data being stored by the flip-flop 100. With the structure of the flip-flop 100, when a particle like an ion, electron. photon, proton, neutron, or the like strikes a sensitive data node in one of the N-wells or P-wells, charge carriers may be generated in the well upon which the particle was incident. For example, a particle P may strike the P-well 108 as shown in FIG. 1. This particle P may generate charge carriers CC that propagate along a longitudinal direction in the P-well 108, where the longitudinal direction is parallel to a Y-axis as illustrated in FIG. 1. These charge carriers CC can travel relatively large distances in the P-well 108 along the longitudinal direction. The charge carriers CC do not, however, travel relatively large distances in a transverse direction that is parallel to an X-axis as shown in FIG. 1, where the transverse direction is orthogonal to the longitudinal direction. Such charge carriers may be impeded by potential barriers the junctions (e.g., PN junctions) formed between different concentrations of material, for example.

In this example, the particle P and resulting charge carriers CC generated in the P-well 108 could upset or change the voltage levels of a large number of transistors formed in the P-well along the longitudinal direction. In the structure of the flip-flop 100, however, only a single data node associated with the N-type transistor 106 of the latch circuit 102A or a single data node associated with the N-type transistor 122 of the latch circuit 102B may be upset or changed due to the particle P. Each of the latch circuits 102A, 102B has a structure that can withstand the change or upset of a single data node in the latch circuit while still maintaining the data being stored, as will be further described in more detail below. This is contrary to latch circuits where the N-type and P-type transistors forming the latch circuit are formed in the same P-well and N-well, and thus multiple transistors of given latch circuit extend along a longitudinal length of a given P-well and N-well. In such a structure, a particle P incident on the P-well or N-well may travel a relatively large distance along the longitudinal direction of the incident well, and the corresponding generated charge carriers CC may upset or change the voltage levels of multiple nodes in a given latch circuit, thereby changing or corrupting the data being stored. This is particularly true in today's state-of-the art circuits where distances between regions of transistors formed in a given P-well or N-well are formed nanometers (nm) apart. A particle P incident upon a P-well or N-well may generate charge carriers CC that can travel for distances on the order a micrometer (μm) along the longitudinal direction of the well. As a result, a particle P and the generated charge carriers CC could accordingly affect data nodes associated with a large number of transistors formed in the well upon which the particle was incident.

In one embodiment, the flip-flop 100 may include a plurality of flip-flop circuits that form a multibit flip-flop. In the embodiment of FIG. 1, the P-well 108 is between the first N-well 112 and second N-well 120 in substrate 104. The present example shows separate wells formed in the substrate 104 for the P-wells 108, 116 and N-wells 112, 120. However, the substrate itself may have some concentration (e.g., P-type or N-type). Accordingly, separation of different N wells may comprise a portion of a P-type substrate between adjacent N-wells, or alternatively, separation of different P wells may comprise a portion of a N-type substrate between adjacent P-wells, for example.

Figure 2:
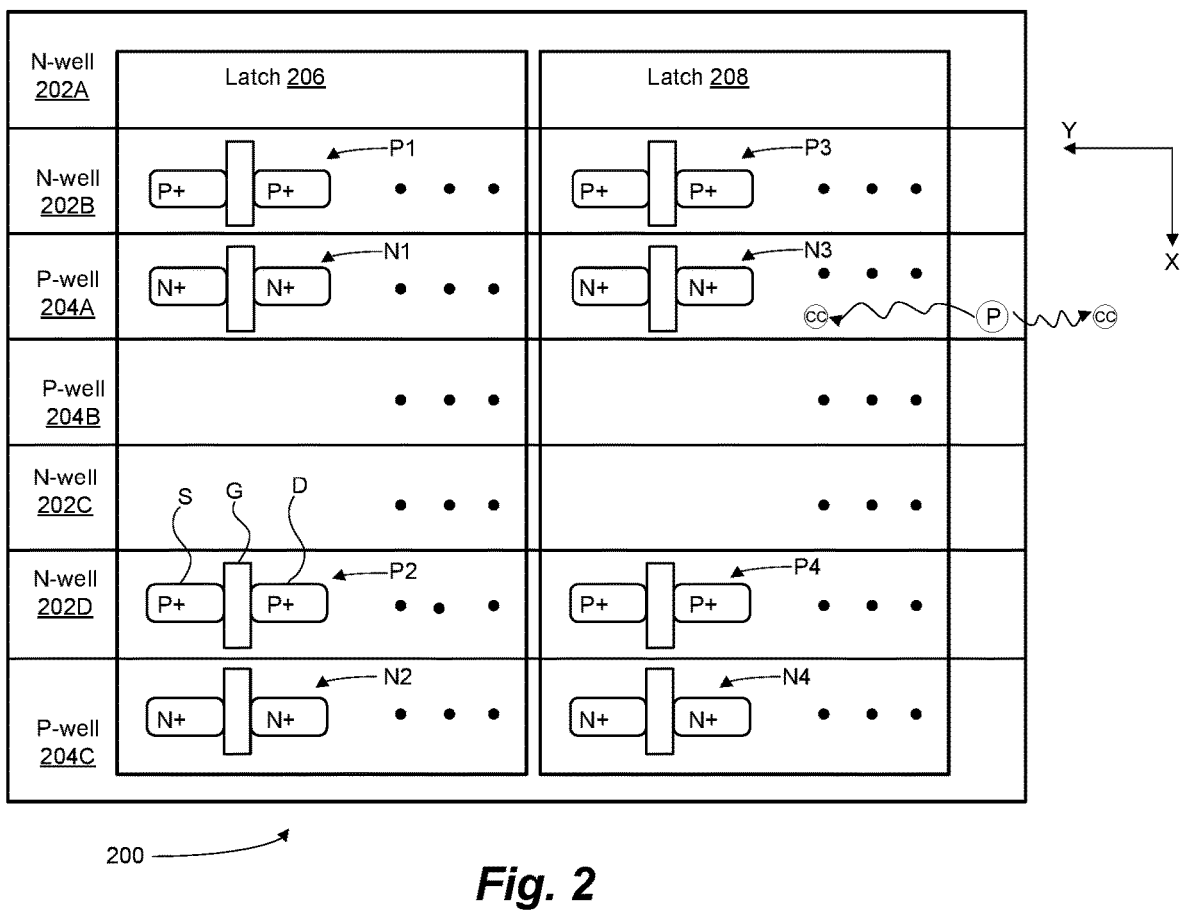
FIG. 2 is a top view illustrating a physical layout of a distributed flip-flop according to another embodiment.

FIG. 2 is a top view illustrating a physical layout of a distributed multibit flip-flop 200 according to another embodiment. Multibit flip-flop 200 is formed in a plurality of N-wells 202A-202D and P-wells 204A-204C formed in a substrate (not shown). In this example, each of the N-wells 202A-202D is formed as part of an adjacent pair of wells in the substrate. Thus, the pair of N-wells 202A and 202B are formed adjacent to one another in the substrate as are the pair of N-wells 202C and 202D. The same is true for the P-wells with the pair of P-wells 204A and 204C formed adjacent one another in the substrate and the P-well 204C formed adjacent another P-well 204D in the substrate that is not shown in FIG. 2.

Multibit flip-flop 200 includes a first latch circuit 206 and a second latch circuit 208, each latch circuit including N-type and P-type transistors formed in selected ones of the N-wells 202A-202 P-wells 204A-C. More specifically, the latch circuit 206 includes a first P-type transistor P1 and second P-type transistor P2 formed in the N-wells 202B and 202D, respectively, and a first N-type transistor N1 and second N-type transistor N2 formed in the P-wells 204A and 204C, respectively. Similarly, the latch circuit 208 includes a first P-type transistor P3 and second P-type transistor P4 formed in the N-wells 202B and 202D, respectively, and a first N-type transistor N3 and second N-type transistor N4 formed in the P-wells 204A and 204C, respectively. Each of the transistors P1-P4 and N1-N4 is a metal-oxide-semiconductor (MOS) transistor in the illustrated embodiment and thus each transistor includes a corresponding gate region along with source and drain regions. These regions are labeled for the P-type transistor P2, with the gate region labeled G, the source region labeled S, and the drain region labeled D. The corresponding components for the transistors P1, P3, P4 and N1-N4 are illustrated but not expressly labeled in the figure. The gate regions G of the transistors P1-P4 and N1-N4 extend in a transverse direction (e.g., along the x-axis as shown) across each of the corresponding N-wells 202B, 202D and P-wells 204A, 204C. The corresponding source region S and drain region D are formed in the corresponding N-wells 202B, 202D and P-wells 204A, 204C to the left and right of the corresponding gate regions G. Complementary pairs of transistors (e.g., having opposite polarities) may be configured in series by electrically connecting drains of two devices. Such connected drains may form a node that may store a voltage corresponding to a data bit value, for example. Such a node is referred to herein as a data node (or alternatively, data storage node). For instance, the P+ drain of P1 may be coupled to the N+ drain of N1 and the P+ of P2 may be coupled to the N+ drain of N2. A variety of resilient latch structures may be produced from series configurations of complementary transistor pairs formed in different wells as described herein.

In a similar way as described above in relation to the embodiment of FIG. 1, the components of the multibit flip-flop 200 are distributed and arranged among the N-wells 202A-202D and P-wells 204A-204C to eliminate or reduce the chances that a single event upset on one of the data nodes in each of the latch circuits 206 and 208 will cause the data stored by each of these latch circuits to change state or become corrupted. For example, if a particle P strikes the P-well 204A as shown, charge carriers CC may be generated in this P-well and these charge carriers propagate along a longitudinal direction of the P-well. The longitudinal direction of the P-well 204A is parallel to a Y-axis as illustrated in FIG. 2. The same is true for the other P-wells 204B, 204C and N-wells 202A-202D. As described above, these charge carriers CC can travel relatively large distances in the P-well 204A along the longitudinal direction but do not travel relatively large distances in the transverse direction (parallel to the X-axis) across the P-well. As a result of the distributed arrangement of the transistors P1-P4 and N1-N4 in the N-wells 202B, 202D and P-wells 204A, 204C, only one data node associated with the transistor N1 in the latch circuit 206 and one data node associated with the transistor N3 in the latch circuit 208 may be disrupted or change state as a result of the single event upset in the form of the incident particle P upon the P-well 204A. Each of the latch circuits 206, 208 has a structure that can withstand such a single event upset so that such a single event upset will not corrupt the data being stored by the latch circuit.

Figure 3:
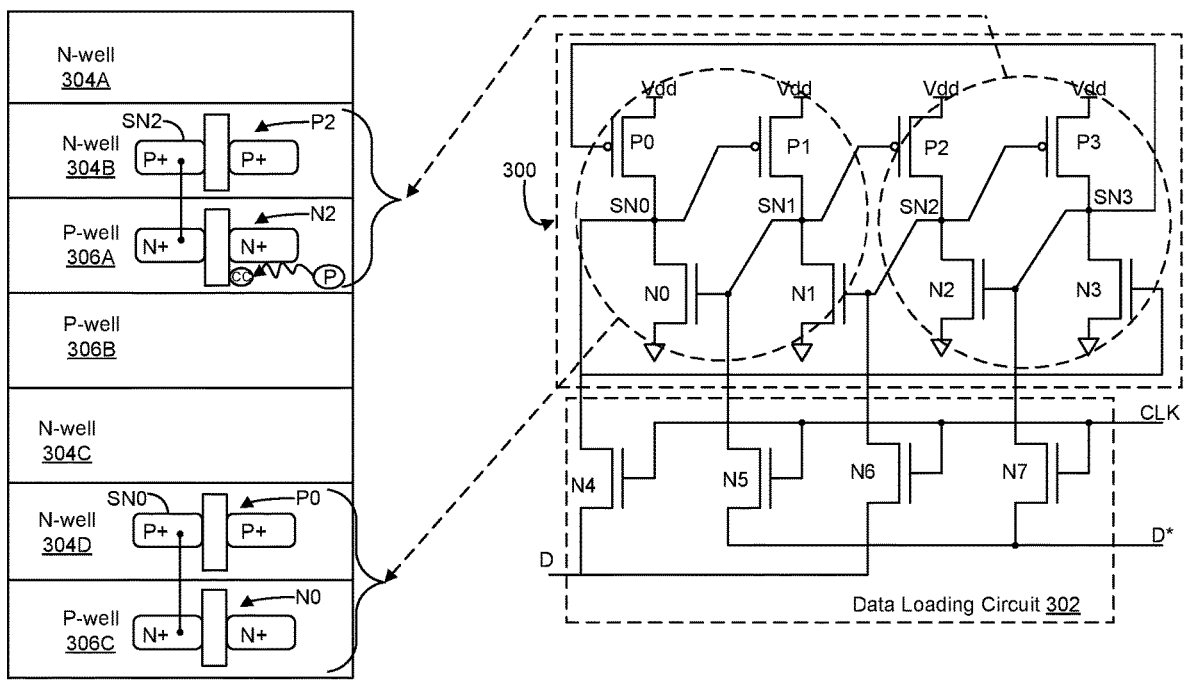
FIG. 3 is a schematic and physical layout top view of a distributed dual interlocked cell latch structure according to another embodiment.

FIG. 3 is a schematic and physical layout top view of a distributed dual interlocked cell (DICE) latch circuit 300 according to one example embodiment. The DICE latch circuit 300 is one embodiment for each of the latch circuits 102A, 102B of FIG. 1 and the latch circuits 206, 208 of FIG. 2. In this example, DICE latch circuit 300 is an eight-transistor circuit including N-type transistors N0-N3 and P-type transistors P0-P3 coupled between a supply voltage node Vdd and reference voltage of ground. Other embodiments of a DICE latch circuit may use the techniques described herein in other implementations as would be known to one of skill in the art. Here, DICE latch circuit 300 includes four storage nodes SN0-SN3, where the storage nodes SN0 and SN2 store the original data (D) supplied to the DICE latch circuit 300 by a data loading circuit 302. The DICE latch circuit 300 further includes two complementary storage nodes SN1 and SN3 that store the complement of the original data (D*) stored on nodes SN0, SN2. The left portion of FIG. 3 shows a plurality of N-wells 304A-304D and a plurality of P-wells 306A-C in which at least some of the transistors P0-P3 and N0-N3 are formed. More specifically, the transistors P2 and N2 are formed in N-well 304B and P-well 306A, respectively, while the transistors P0 and N0 are formed in N-well 304D and P-well 306C, respectively.

In operation, when any one of the storage nodes SN0-SN3 has its state changed by a single event transient, such as a particle incident upon a well in which the data storage node is contained, the remaining unaffected data storage nodes (e.g., in other wells) drive the corresponding transistors P0-P3 and N0-N3 to restore the state of the data storage node that was contaminated. More specifically, each of pair of series connected complementary transistors (P0, N0), (P1, N1), (P2, N2), (P3, N3) may form an inverter with a corresponding one of the data storage nodes SN0-SN3 defined at an interconnection of the corresponding pair of complementary transistors. One transistor of each inverter is driven by one of the data storage nodes SN0-SN3 that is unaffected by the single event transient, restoring or maintaining the corresponding storage node SN0-SN3 at the proper level or in the proper state. For example, assume the storage nodes SN0, SN2 are at low voltage levels corresponding to a logic 0, which means the storage nodes SN1, SN3 are at high voltage levels corresponding to a logic 1. Now assume a single event transient in the form of a particle P strikes the P-well 306A as illustrated. This particle P may cause charge carriers CC to be generated in the P-well 306A that would drive the storage node SN2 to a different state, or from a low voltage level (logic 0) to a high voltage level (logic 1) in this example. But the storage node SN3, which is at a high voltage level and is unaffected by the particle P incident on P-well 306A, continues to drive the gate of transistor N2 so that transistor N2 stays turned ON to maintain the storage node SN2 at the low voltage level. The storage node SN1 is at a high voltage level (logic 1) and is not affected by the incident particle P, and because the storage node SN1 drives the gate of the transistor P2 this transistor remains turned OFF and does not affect the state of the storage node SN2.

DICE latch circuit 300 operates in a similar manner as described above for a particle P incident upon the P-well 306A for particles P incident upon the other P-wells 306B-306C and the N-wells 304A-304D. In DICE latch circuits where the P-type transistors are formed in the same N-well and the N-type transistors are formed in the same P-well, a particle incident upon one of these P-wells or N-wells may result in transients on multiple ones of the data storage nodes SN0-SN3, potentially corrupting the data being stored by the latch circuit. This is true because, as mentioned above, where the components of the transistors are formed nanometers apart along the longitudinal direction of the P-wells and N-wells, an incident particle can result in charge carriers that propagate a relatively large distance along this longitudinal direction and result in state changes or transients on multiple ones of the storage nodes SN0-SN3 and thereby cause errors in the operation of the latch circuit.

A flip flop may include a DICE latch 300 and a data loading circuit 302. Data loading circuit 302 receives a data signal D and a complementary data signal D*, which are loaded into the DICE latch circuit 300. The data loading circuit 302 includes transistors N4 -N7 coupled to storage nodes SN0-SN3, respectively. Each of the transistors N4-N7 receives a clock signal CLK to control activation of the transistor and thereby control loading of the complementary data into the DICE latch circuit 300. In operation, responsive to the clock signal CLK being active high, and thereby turning ON the transistors N4-N7, the data loading circuit 302 provides the data input signal D to the data storage node SN0 and data storage node SN2, and provides the complementary data signal D* on the data storage node SN1 and data storage node SN3. Once the data loading circuit 302 has driven the storage nodes SN0-SN3 their desired states, the clock signal CLK is deactivated (i.e., driven low in this example) to thereby turn OFF the transistors N4-N7, and D and D* are stored in the DICE latch circuit.

Features and advantages of the present disclosure may further include techniques for coupling unwanted charge to a charge extraction device in one of the wells described above. FIGS. 4A and 4B illustrate portions of a latch circuits 400A and 400B including first and second pairs of complementary transistors and respective charge extraction transistors coupled to respective data storage nodes in the latch circuit according to further embodiments of the present disclosure. As shown in FIG. 4A, the portion of latch circuit 400A includes a first pair of complementary transistors P1 410 and N1 411 coupled in series with a first data storage node SN1 defined at the interconnection of these transistors. A first N-type charge extraction transistor N2 412 has a drain coupled to the first data storage node SN1, a gate coupled to receive a reference voltage Vss (e.g., ground) and a source coupled to receive a supply voltage Vcc. In this way, the reference voltage Vss and supply voltage Vcc bias the first charge extraction transistor N2 in a nonconductive state (i.e., the transistor is turned OFF). A top view of the layout of the N-type transistors N1 and N2 is shown at 401A. In this example, the drain of the charge extraction transistor N2 is formed in an N+ region formed in a P-well 403A, where this N+ region is shared with the drain of the transistor N1 of the first pair of complementary transistors N1, P1. A cross-sectional view of the N-type transistors N1, N2 is shown at 402A, which shows that the N-type transistors are formed in the P-well 403A, which is, in turn, formed in a substrate 404. The drain regions of the transistors N1, N2, which also form data storage node SN1, are shared. Advantageously, charge extraction transistor N2 may couple unwanted charge out of the well and into the higher potential Vcc, further protecting the digital circuitry erroneous state changes, for example.

FIG. 4B illustrates another embodiment using a P-type charge extraction transistor. As shown in FIG. 4B, a portion of latch circuit 400B includes a second pair of complementary transistors P2 420, N3 421 coupled in series with a second data storage node SN2 defined at the interconnection of these transistors. A second N-type charge extraction transistor P3 422 has a drain coupled to the second first data storage node SN2, a gate coupled to receive a supply voltage Vcc and a source coupled to receive a reference voltage Vss. In this way, the reference voltage Vss and supply voltage Vcc bias the second charge extraction transistor P3 in a nonconductive state (i.e., the transistor is turned OFF). At 401B of FIG. 4B is a top view of the layout of the P-type transistors P2, P3 where the drain of the charge extraction transistor P3 is formed in a doped material, which is a P+ region formed in an N-well 403B in this embodiment. This P+ region is shared with the drain of the transistor P2 of the second pair of complementary transistors N3, P2. At 402B of FIG. 4B is a cross-sectional view of the P-type transistors P2, P3 formed in the N-well 403B, which is, in turn, formed in the substrate 404. The drain regions of the transistors P2, P3 are shared and correspond to the data storage node SN2 in the top portion of FIG. 4B.

In operation, each of the charge extraction transistors N2, P3 function to extract or remove charge generated by a single event transient, such as a particle P incident on the corresponding storage node SN1, SN2, to thereby prevent the level or state of a data storage node from changing to thereby maintain the data stored by the latch circuit. For example, a particle P incident on the data storage node SN1 generates charge carriers CC that are then removed from or "extracted" from the data storage node to the drain of the charge extraction transistor N2 as indicated by the arrow in middle portion of FIG. 4A. The charge carriers CC generated by the particle P in the N+ storage node SN1 are electrons and these electrons propagate from the data storage node through the P-well to the drain region of the charge extraction transistor N2. Such charge may be captured and extracted by drain coupled to the supply voltage Vcc. The second charge extraction transistor P3 operates in a similar way in relation to the data storage node SN2 and second pair of complementary transistors P2, N3. Thus, a particle P incident on the storage node SN2 generates charge carriers CC that are then removed from or "extracted" from the storage node to the drain of the second charge extraction transistor P3 as indicated by the arrow in middle portion of FIG. 4B. The charge carriers CC generated by the particle P in the P+ storage node SN2 are holes and these holes propagate from the storage node and through the N-well to the drain region of the charge extraction transistor P3, which is coupled to the reference voltage Vss.

FIGS. 4A-B illustrate alternative embodiments using N and P type charge extraction transistors. It is to be understood that various embodiments may use either or both of these devices to extract charge from a well, for example.

Figure 5:
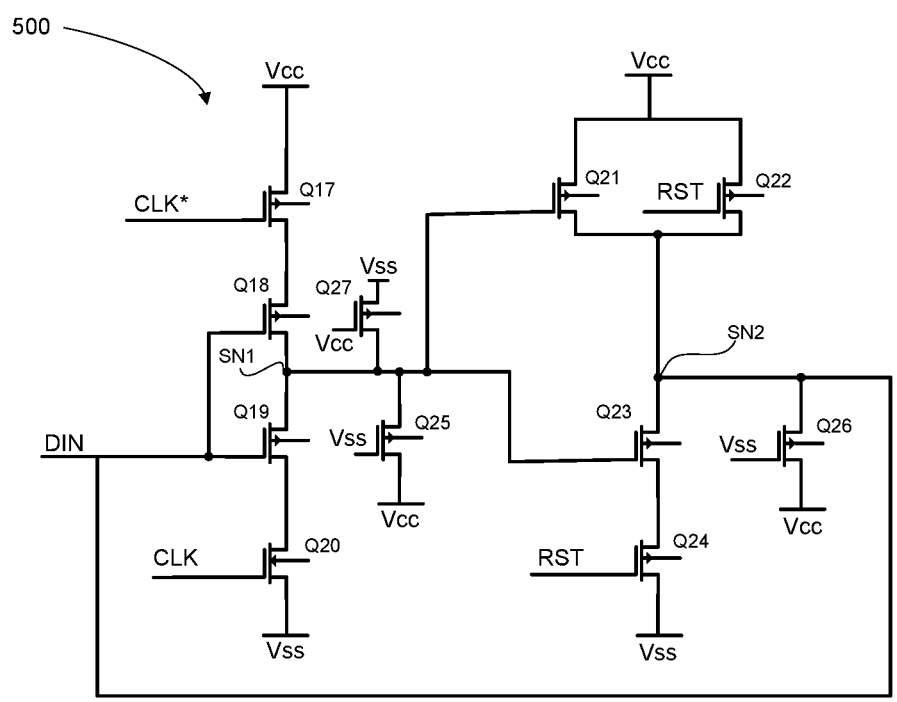
FIG. 5 is a schematic of a latch circuit including charge extraction transistors coupled to a data storage nodes of the latch circuit according to a further embodiment of the present disclosure.

FIG. 5 is a schematic of an example clocked latch circuit 500 including several charge extraction transistors coupled to two data storage nodes SN1, SN2 according to a further embodiment of the present disclosure. The clocked latch circuit 500 includes transistors Q17-Q27 coupled as shown in FIG. 5, with each of these transistors being either an N-type transistor or P-type transistor as indicated by the corresponding schematic symbol for that transistor. A first pair of complementary transistors Q18 and Q19 are coupled in series to form a first inverter with the first data storage node SN1 being defined at the interconnection of these transistors. A second pair of complementary transistors Q21 and Q23 are coupled in series to form a second inverter with the second data storage node SN2 being defined at the interconnection of these transistors.

In the embodiment of FIG. 5, a first N-type charge extraction transistor Q25 and a second complementary P-type charge extraction transistor Q27 are coupled to the first data storage node SN1. In operation, these first and second charge extraction transistors Q25 and Q27 function to remove or extract charge carriers generated on the data storage node SN1, which may be in response to a particle P striking a well as previously described. In this way, the charge extraction transistors Q25 and Q27 allow a voltage level on the data storage node SN1 to be maintained even upon the occurrence of the strike of a particle P. Similarly, a third charge extraction transistor Q26 is coupled to the second data storage node SN2 and functions to remove or extract charge carriers, for example. The third charge extraction transistor Q26 in this way enables a voltage level on the second data storage node SN2 to be maintained.

Example latch circuit 500 further includes a first reset transistor Q24 coupled in series with the second complementary pair of transistors Q21 and Q23 coupled between a supply voltage Vcc and a reference voltage Vss. A second reset transistor Q22 is coupled in parallel with the transistor Q21 between the supply voltage Vcc and the second data storage node SN2. In this example latch circuit, each of the reset transistors Q24, Q22 receives a reset signal RST on its gate. During normal operation, the reset signal RST is driven high causing the N-type reset transistor Q24 to turn ON and the P-type reset transistor Q22 to turn OFF. When the N-type reset transistor Q24 is turned ON the second complementary pair of transistors Q21, Q23 forming the second inverter are coupled between the supply voltage Vcc and reference voltage Vss. Conversely, when the reset signal RST is driven low the latch circuit 500 is reset. More specifically, in response to the low reset signal RST the reset transistor Q24 turns OFF and reset transistor Q22 turns ON, coupling the second storage node SN2 to the supply voltage Vcc. In this way, the second storage node SN2 is reset to a high voltage level. In response to the high voltage on the second storage node the transistors Q18, Q19 forming the first inverter drive the voltage level on the first storage node SN1 to a low voltage level. Thus, when the reset signal RST goes active low, the voltage level on the second storage node SN2 is driven to a high voltage level and the voltage level on the first storage node SN1 is driven to a low voltage level to thereby reset the latch circuit 600.

The latch 500 further includes the clocking transistors Q17 and Q20 coupled in series with the first pair of complementary transistors Q18, Q19 forming the first inverter. The clocking transistors Q17, Q20 receive complementary clock signals CLK, CLK* which are active low and high, respectively, to turn ON each of the clocking transistors and thereby couple the transistors Q18, Q19 of the first inverter between the supply voltage Vcc and reference voltage Vss. In normal operation of the latch circuit 500, the reset signal is driven active high to turn ON transistor Q24 and turn OFF transistor Q22. The complementary clock signals CLK, CLK* are driven active high and low, respectively, activating the first inverter formed by the pair of complementary transistors Q18, Q19. Data DIN to be stored in the latch 500 may then supplied from an external circuit (not shown) to the input of the first inverter, for example. This first inverter drives first data storage node SN1 to a voltage level corresponding to the complement of the voltage level of the data DIN. In response to the voltage level on the first data storage node SN1, the second inverter formed by the second pair of complementary transistors Q21, Q23 drives the second data storage node SN2 to the voltage level corresponding to the complement of the voltage level on the first data storage node SN1, which is the same voltage levels as that of the data DIN. The voltage level on the data storage node SN2 is fed back to drive the input of the first inverter. As will be appreciated by those skilled in the art, the first and second inverters formed by complementary transistors Q18, Q19 and Q21, Q23 form a pair of cross-coupled inverters that function in combination to store data on the storage nodes SN1, SN2 in the latch circuit 500.

As mentioned above, latches according to various embodiments may use some or all of the techniques disclosed herein. For example, in one embodiment, the transistors in latch circuit 500 may be formed across multiple N and P wells as described in FIGS. 1 and/or 2 above. More specifically, P-type transistors Q18 and Q27 may be formed in one N-well and N-type transistors Q19 and Q25 may be formed in one P-well, whereas P-type transistor Q21 may be formed in a different N-well than Q18/Q27 and N-type transistors Q23 and Q26 may be formed in a different P-well than Q19, for example.

Further Example Embodiments

In various embodiments, the present disclosure includes systems, methods, and apparatuses for resilient data storage. The following techniques may be embodied alone or in different combinations and may further be embodied with other techniques described herein.

In one embodiment, the present disclosure includes a plurality of flip flops, each flip flop comprising a plurality of latches, each latch comprising: a first N-type transistor formed in a first P-type material; a first P-type transistor formed in a first N-type material; a second N-type transistor formed in a second P-type material; and a second P-type transistor formed in a second N-type material, wherein the first and second N-type transistors are formed in different P-wells and the first and second P-type transistors are formed in different N-wells.

In one embodiment, the first P-type material is adjacent to the first N-type material, and the second P-type material is adjacent to the second N-type material.

In one embodiment, the first P-type material, the first N-type material, the second P-type material, and the second N-type material are a plurality of wells arranged in alternating strips.

In one embodiment, the first N-type transistor and the first P-type transistor are configured in series to form a first inverter, the second N-type transistor and the second P-type transistor are configured in series to form a second inverter, and wherein a data storage node of the first inverter is coupled to a gate of at least one of the second N-type transistor or the second P-type transistor.

In one embodiment, the plurality of flip flops form a multibit flip flop.

In one embodiment, a plurality of gates of the first N-type transistor, the first P-type transistor, the second N-type transistor, and the second P-type transistors are configured in line along a first axis.

In one embodiment, each of the first P-type material and second P-type material comprises a P-well formed in a substrate.

In one embodiment, each of the first N-type material and second N-type material comprises an N-well formed in a substrate.

In one embodiment, one or more P-wells are configured between one or more N-wells.

In one embodiment, each of the latches comprises a dual interlocked cell.

In one embodiment, each dual interlocked cell comprises a plurality of inverters, wherein a data storage node of each inverter is coupled to a P-type transistor in a first other inverter in the plurality of inverters and to a N-type transistor in a second other inverter of the plurality of inverters.

In another embodiment, the present disclosure includes a plurality of flip flops, each flip flop comprising a plurality of latches, each latch comprising: a first pair of complementary transistors configured in series; a second pair of complementary transistors configured in series; at least one charge extraction transistor having a gate coupled to a first potential, a source coupled to a second potential, and a drain coupled to a data storage node of one of the first or second pairs of complementary transistors, wherein the first potential and second potential bias the at least one charge extraction transistor in a nonconductive state; and wherein the drain of the at least one charge extraction transistor is formed in a doped material shared with a drain of a transistor of the first or second pairs of complementary transistors.

In one embodiment, the at least one charge extraction transistor has a same device type as said transistor of the first or second pairs of complementary transistors.

In one embodiment, the first charge extraction transistor is a N-type transistor formed in a P-well and said transistor of the first or second pairs of complementary transistors is a N-type transistor.

In one embodiment, the first charge extraction transistor is a P-type transistor formed in a N-well said transistor of the first or second pairs of complementary transistors is a P-type transistor.

In one embodiment, the at least one charge extraction transistor is a N-type transistor configured in a same P-well as a N-type transistor of the first pair of complementary transistors, and further comprising a P-type charge extraction transistor formed in a doped material shared with a drain of a P-type transistor configured in a same N-well of the first pair of complementary transistors, wherein the P-type charge extraction transistor has a gate coupled to the second potential, a source coupled to the first potential, and a drain coupled to the data storage node, wherein the first potential and second potential bias the P-type charge extraction transistor charge extraction transistor in a nonconductive state.

In one embodiment, the first pair of complementary transistors are further configured in series with one or more transistors configured to receive a clock signal.

In one embodiment, the second pair of complementary transistors are further configured in series with one or more transistors configured to receive a reset signal.

In one embodiment, gates of the first pair of complementary transistors are coupled together, gates of the second pair of complementary transistors are coupled together, a first data storage node of the first pair of complementary transistors is coupled to the gates of the second pair of complementary transistors, and a second data storage node of the second pair of complementary transistors is coupled to the gates of the first pair of complementary transistors.

In one embodiment, wherein: the first pair of complementary transistors comprise a first N-type transistor formed in a first P-type material and a first P-type transistor formed in a first N-type material, the second pair of complementary transistors comprise a second N-type transistor formed in a second P-type material and a second P-type transistor formed in a second N-type material, and wherein the first and second N-type transistors are formed in different P-wells and the first and second P-type transistors are formed in different N-wells.

The various features and processes described above may be used independently of one another or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A multibit flip flop, comprising:
   a plurality of N-wells and a plurality of P-wells arranged in alternating strips in a substrate;
   a first latch circuit, including:
      a first inverter including a first N-type transistor coupled in series with a first P-type transistor;
      a second inverter including a second N-type transistor coupled in series with a second P-type transistor, the first and second N-type transistors being formed in different ones of the plurality of P-wells and the first and second P-type transistors being formed in different ones of the plurality of N-wells; and
   a second latch circuit, including:
      a first inverter including a first N-type transistor coupled in a series with a first P-type transistor;
      a second inverter including a second N-type transistor coupled in series with a second P-type transistor, the first N-typed transistor of the second latch circuit and the first N-type transistor of the first latch circuit being formed in the same one of the plurality of P-wells, the second N-type transistor of the second latch circuit and the second N-type of the first latch circuit being formed in the same one of the plurality of P-wells, the first P-type transistor of the second latch circuit and the first P-type transistor of the first latch circuit being formed in the same one of the plurality of N-wells, and the second P-type transistor of the second latch circuit and the second P-type transistor of the latch circuit being formed in the same one of the plurality of N-wells.

2. The multibit flip flop of claim 1, wherein a data storage node of the first inverter in ach of the first and second latch circuits is coupled to a gate of at least one of the second N-type transistor or the second P-type transistor in the corresponding second inverter.

3. The multibit flip flop of claim 1, wherein a plurality of gates of the N-type transistor and P-type transistors are configured in line along a first longitudinal axis of a corresponding P-well or N-well.

4. The multibit flip flop of claim 1, wherein one or more P-wells are configured between adjacent groups of one or more N-wells.

5. The multibit flip flop of claim 1, wherein each of the first and second latch circuits comprises a dual interlocked cell.

* * * * *